United States Patent
Edmunds et al.

(10) Patent No.: US 11,980,011 B2
(45) Date of Patent: May 7, 2024

(54) COLD PLATE

(71) Applicant: ICEOTOPE GROUP LIMITED, South Yorkshire (GB)

(72) Inventors: Neil Edmunds, South Yorkshire (GB); Alexander Cushen, South Yorkshire (GB); Mustafa Kadhim, South Yorkshire (GB)

(73) Assignee: Iceotope Group Limited, South Yorkshire (GB)

( * ) Notice: Subject to any disclaimer, the term of this patent is extended or adjusted under 35 U.S.C. 154(b) by 269 days.

(21) Appl. No.: 17/611,377

(22) PCT Filed: May 21, 2020

(86) PCT No.: PCT/GB2020/051244
§ 371 (c)(1),
(2) Date: Nov. 15, 2021

(87) PCT Pub. No.: WO2020/234599
PCT Pub. Date: Nov. 26, 2020

(65) Prior Publication Data
US 2022/0210949 A1 Jun. 30, 2022

(30) Foreign Application Priority Data
May 21, 2019 (GB) .................................... 1907179

(51) Int. Cl.
*H05K 7/20* (2006.01)
(52) U.S. Cl.
CPC ..... *H05K 7/20509* (2013.01); *H05K 7/20254* (2013.01); *H05K 7/20272* (2013.01)
(58) Field of Classification Search
CPC .......... H05K 7/20272; H05K 7/20509; H05K 7/20254; F28F 3/12; F28F 3/022
See application file for complete search history.

(56) References Cited

U.S. PATENT DOCUMENTS 5,370,178 A * 12/1994 Agonafer ............... H01L 23/473
257/E23.098
6,125,035 A * 9/2000 Hood, III ............ F28D 15/0275
361/679.55
(Continued)

FOREIGN PATENT DOCUMENTS

CN 109392294 A 2/2019
WO 2020234599 A1 11/2020

OTHER PUBLICATIONS

Seach Report for App. No. GB1907179.4, dated Aug. 28, 2019, 5 pages.
(Continued)

*Primary Examiner* — Adrian S Wilson
(74) *Attorney, Agent, or Firm* — Butzel Long

(57) ABSTRACT

A cold plate, comprises: a housing having a surface providing a thermal interface for cooling an electronic device; a channel within the housing proximate to the surface for a liquid coolant to flow therethough such that heat received by the thermal interface is transferred to the liquid coolant; and a coolant port extending outside the housing, for transferring liquid coolant to and/or from the channel. A cross-sectional area of an outlet from the coolant port to the channel may be no larger than that of the channel at the outlet. Pins and/or fins may be arranged within the channel adjacent to the coolant port. The coolant port may cause liquid coolant to enter and/or exit the channel in a direction perpendicular to the surface. The coolant port may comprise an independent rotating fluid connector thereby allowing adjustment in the direction of a pipe coupled to the coolant port.

20 Claims, 14 Drawing Sheets

(56) References Cited

U.S. PATENT DOCUMENTS

| | | | |
|---|---|---|---|
| 6,134,106 A * | 10/2000 | Tao | F28D 15/02 361/679.52 |
| 7,450,385 B1 | 11/2008 | Campbell | |
| 7,724,524 B1 * | 5/2010 | Campbell | H05K 7/20772 165/104.19 |
| 7,916,483 B2 * | 3/2011 | Campbell | H05K 7/20772 165/80.4 |
| 8,944,151 B2 * | 2/2015 | Flotta | H05K 7/20772 165/80.4 |
| 9,504,184 B2 * | 11/2016 | Krug, Jr. | H05K 7/20218 |
| 10,816,279 B2 * | 10/2020 | Huang | F28F 3/10 |
| 10,888,032 B2 * | 1/2021 | Wakino | H01L 23/427 |
| 11,096,313 B2 * | 8/2021 | Amos | H01L 23/473 |
| 11,197,393 B2 * | 12/2021 | Harvilchuck | F28F 9/0275 |
| 11,470,739 B2 * | 10/2022 | Amos | H05K 7/2039 |
| 11,490,546 B2 * | 11/2022 | Edmunds | H05K 7/20772 |
| 11,653,472 B2 * | 5/2023 | Amos | H05K 7/20263 361/699 |
| 11,737,247 B2 * | 8/2023 | Edmunds | H05K 7/203 361/699 |
| 11,778,790 B2 * | 10/2023 | Edmunds | H05K 7/20236 361/679.46 |
| 2004/0182544 A1 * | 9/2004 | Lee | H01L 23/473 257/E23.098 |
| 2005/0210906 A1 | 9/2005 | Laufer | |
| 2005/0243517 A1 * | 11/2005 | Malone | G06F 1/20 361/699 |
| 2006/0050483 A1 | 3/2006 | Wilson | |
| 2008/0314559 A1 * | 12/2008 | Hsu | F28D 9/0037 165/80.4 |
| 2009/0238235 A1 * | 9/2009 | Campbell | H05K 7/20836 250/339.04 |
| 2011/0079376 A1 | 4/2011 | Loong | |
| 2011/0232879 A1 | 9/2011 | Zaffetti | |
| 2012/0170222 A1 * | 7/2012 | Dede | F28F 3/083 165/173 |
| 2013/0105116 A1 | 5/2013 | Campbell | |
| 2013/0107457 A1 * | 5/2013 | Campbell | H05K 7/2079 361/699 |
| 2013/0264701 A1 | 10/2013 | Loong | |
| 2014/0252585 A1 | 9/2014 | Chen | |
| 2015/0109729 A1 * | 4/2015 | Campbell | H05K 7/20772 361/679.47 |
| 2017/0092565 A1 | 3/2017 | Chen | |
| 2018/0098459 A1 | 4/2018 | Chainer | |
| 2022/0110224 A1 * | 4/2022 | Gong | H01L 23/473 |
| 2022/0201896 A1 * | 6/2022 | Edmunds | H05K 7/20263 |
| 2022/0418153 A1 * | 12/2022 | Amos | H05K 7/20772 |
| 2022/0418156 A1 * | 12/2022 | Cushen | H05K 7/20509 |
| 2023/0029001 A1 * | 1/2023 | Edmunds | G06F 1/203 |
| 2023/0096875 A1 * | 3/2023 | Edmunds | H05K 7/20772 361/689 |
| 2023/0240042 A1 * | 7/2023 | Amos | H01L 23/3677 361/679.53 |

OTHER PUBLICATIONS

Seach Report for App. No. GB1907179.4, dated Apr. 10, 2020, 2 pages.

Seach Report for App. No. GB1907179.4, dated Aug. 16, 2021, 3 pages.

International Search Report and Written Opinion for App. No. PCT/GB2020/051244, dated Aug. 14, 2020, 12 pages.

* cited by examiner

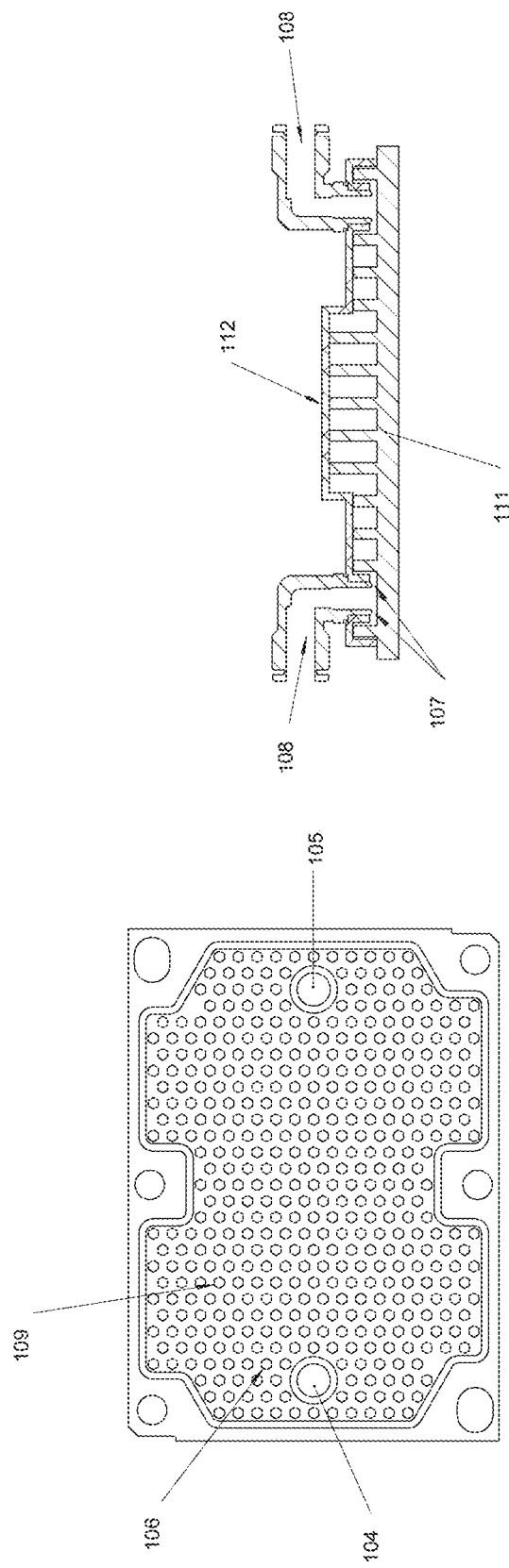

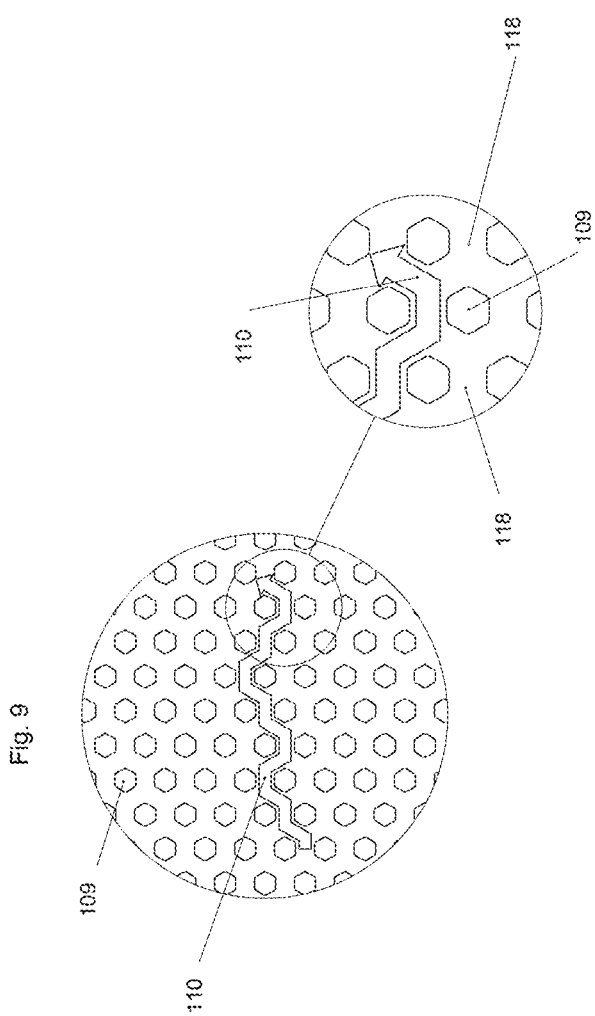

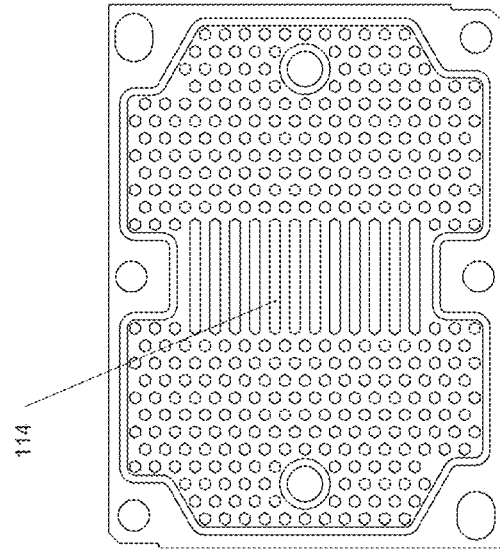
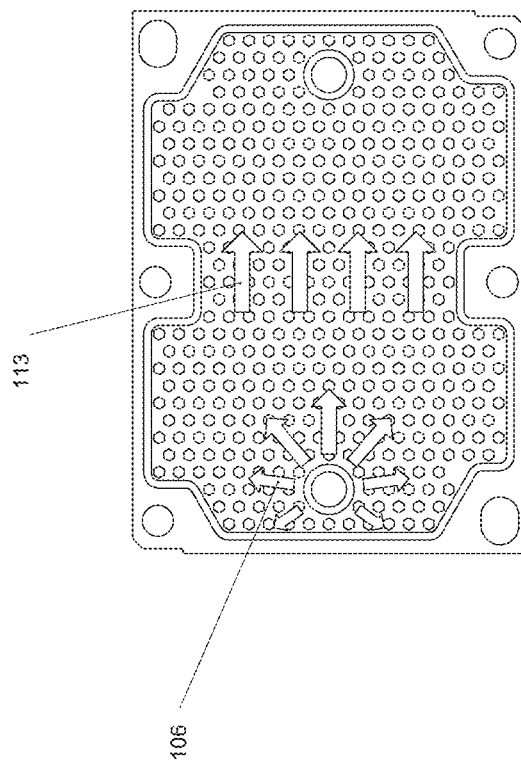

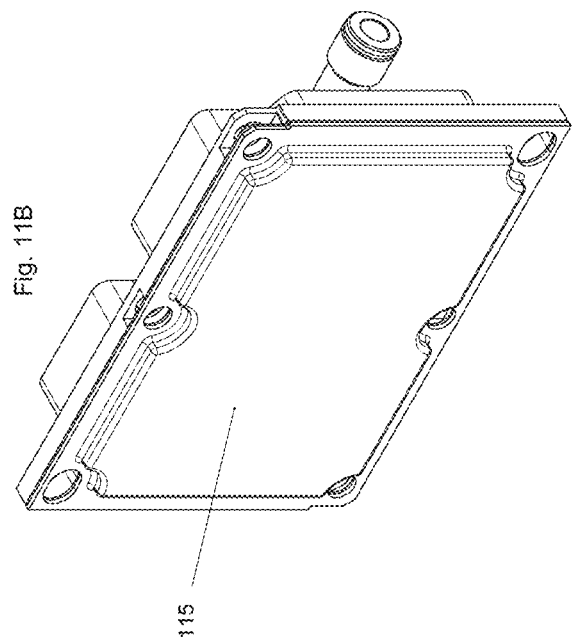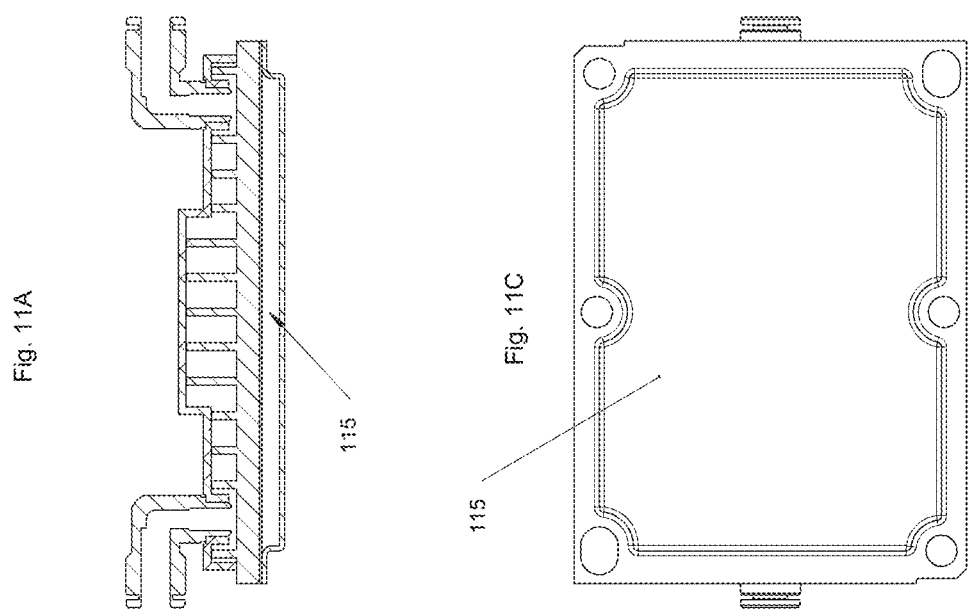

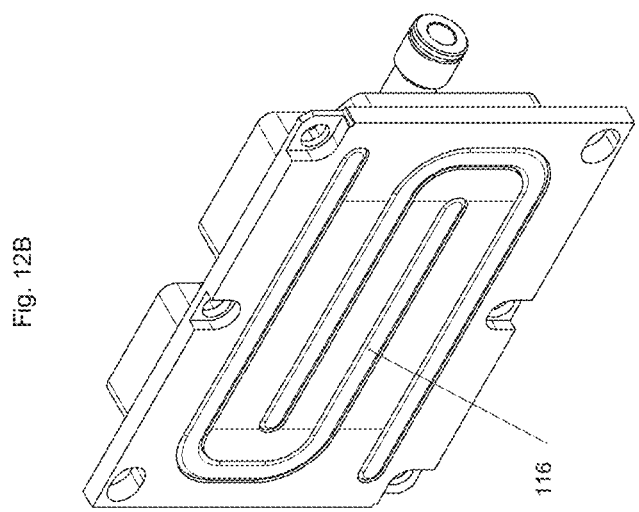
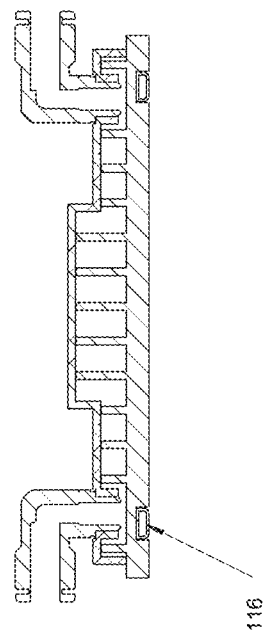
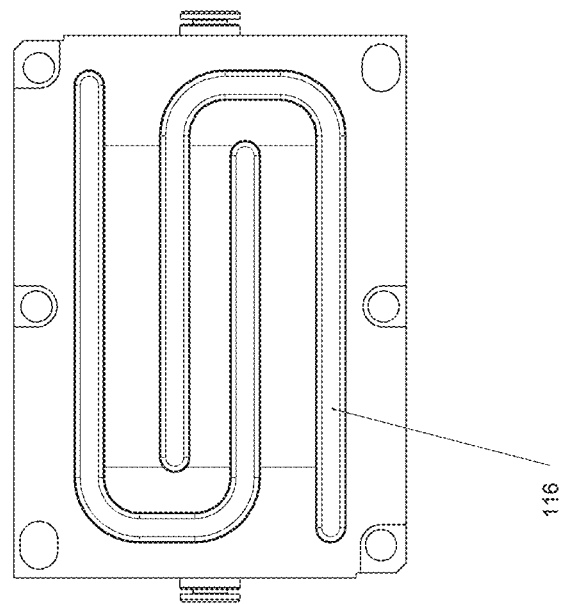

COLD PLATE

TECHNICAL FIELD OF THE DISCLOSURE

The disclosure concerns a cold plate, an electronics module comprising at least one cold plate and an electronics system comprising multiple such electronics modules.

BACKGROUND TO THE DISCLOSURE

Within computers, servers, and other devices used for data processing (referred to as Information Technology or IT) there are printed circuit boards (PCBs). On these PCBs are small devices called Integrated Circuits (IC), which may include central processing units (CPUs), Application Specific Integrated Circuits (ASICs), Graphical Processing Units (GPUs), etc. All of these can be referred to in general as chips.

IT is usually housed within a case, enclosure or housing. In a server for instance, this enclosure is sometimes referred to as the server chassis. A server chassis typically adheres to a number of industry standards that specify the height of each chassis, referred to as 1RU (one rack unit) or 1OU (one open unit), these are also abbreviated to 1U or 1OU. The smaller of the 2 main standards is the 1RU/1U, which is 44.45 mm or 1.75 inches in height. Such units may be referred to as a blade server.

Different server products can utilise more than one RU/OU at a time for the chassis, for example a 2U chassis uses 2 rack units. The size of each server chassis is usually kept to a minimum to maximise the amount of computing power per server rack (a server rack is the main housing that server chassis are added to.

Typically chips that are used on or in IT are cooled using air. This usually includes a heatsink of some kind with fins or similar being placed in contact with the chip surface either directly, or with a TIM (thermal interface material) between the two components. In addition to the heat sink, each enclosure uses a series of fans to pull air through the enclosure, removing heat from the heatsink and expelling it from the chassis.

In more recent times, the peak performance of the heat generating chips has been throttled due to the limitations of cooling a device with air. As technology halves in size for the same performance every couple of years (Moore's law), the heat produced by chips is increasing as the footprint of the component decreases. This has also seen an increase in the size and complexity of heatsinks. This usually means an increase in server chassis size, thus decreasing the computing power within a single rack.

Consequently, this has lead search for a more effective way of cooling these heat producing components in comparison to a large air cooled heatsinks. The different methods that have been explored include using liquids as the coolant. These liquids include dielectric fluids, mineral oil and water to mention a few. A number of existing approaches using liquid cooling are known. For example, International Patent Publication No. 2018/096362, commonly assigned with the present disclosure, describes an immersive liquid cooling approach. The performance and efficiency of such approaches is high, but they require a special server chassis, to retain the liquid coolant. It would be desirable to provide a non-immersive liquid coolant-based system with high performance and efficiency.

SUMMARY OF THE DISCLOSURE

Against this background, there is provided a cold plate, an electronics module and an electronics system.

In embodiments, there is provided a cold plate having a housing (an outer housing), a surface of which provides a thermal interface for cooling an electronic device (such a chip or IC). This surface is typically a bottom surface of the housing. At least one channel is provided within the housing and proximate to the surface and liquid coolant can flow through the channel (or channels, which may be in series or parallel), to receive heat through the thermal interface. Liquid coolant (which may be water or water-based) passes to and from the channel (or channels) through one or more coolant ports. The coolant port (or ports) extends outside the housing, for instance perpendicular to the top surface. Beneficially, the cold plate is designed for single phase, such that the coolant remains essentially as a liquid during operation.

In one main aspect the coolant port comprises an independent rotating fluid connector, such as a swivel joint (which may be a swivel elbow connector and all these terms are used synonymously herein), thereby allowing adjustment in the direction of a pipe coupled to the coolant port. The coolant port or ports are beneficially on a top surface of the housing. The top surface of the housing may be configured (especially in respect of its height and/or shape) to allow adjustment in the direction of a pipe coupled to the coolant port, for instance by having a height that is smaller around the coolant port than away from the coolant port. Where the coolant port has an elbow shape (such that a first part extends in a direction generally perpendicular to the top surface and a second part extends in a direction generally parallel to the top surface), the height difference may be approximately to the bottom of the elbow shape (that is, where a transition from the first part to the second part begins). Preferably, two coolant ports are provided, one (an inlet coolant port) for receiving coolant from outside the cold plate (such as from an external pipe) and providing it to the channel and one (an outlet or exhaust coolant port) for receiving coolant from the channel (or channels) and transferring to an external pipe. Any features described with reference to a coolant port herein may be applied to both coolant ports. The two coolant ports are preferably provided at opposite ends of the housing, which may be elongated. Piping, tubing or hoses (preferably flexible) are advantageously coupled to the coolant port or ports in operation.

Advantageously, the swivel joint allows significant flexibility in the placement and therefore efficiency of the cold plate. The use of a swivel joint may allow a cold plate to be placed at a variety of locations within an enclosure (such as a server chassis) and in a variety of orientations. In this way, a more optimal placement of the cold plate may be provided than would be possible with a fixed coolant port (or fixed coolant ports). Preferably, the swivel joint allows the direction of the pipe to be adjusted around an axis perpendicular to the top surface of the housing and/or allows 360 degree rotational freedom. In particular, the cold plate may be installed onto/into an existing piece of hardware in a flexible way. By rotating the connections, the installer can choose the most efficient route for piping, tubing or hoses to enter and exit the server chassis. Nozzle or connector rotation may help to direct the tubes or hoses around existing components. The tubes or hoses that connect to the cold plate can be directed between existing components while the rotation on the connector also helps to stop the bend radii on the tubes from being too tight. These benefits increase performance and efficiency accordingly. Variable sizes of cold plates may be used, to cool a variety of different chips or heat producing components and be mechanically mounted to a variety of fixture points.

In another main aspect (which may be combined with the other main aspect or any other aspect), one or more features are provided which may reduce the pressure drop and/or provide a low (preferably minimal) pressure drop between piping external the cold plate and within the cold plate.

In particular, the feature or features comprise one or more of: (a) liquid coolant enters and/or exits the channel in a direction perpendicular to the thermal interface surface (and/or a bottom surface of the channel, typically proximate the thermal interface surface of the housing); (b) a cross-sectional area of an outlet from the coolant port to the channel is no larger than a cross-sectional area of the channel at the outlet (in other words, the flow capacity of the channel is at least as large as the flow capacity of the coolant port outlet into the channel); and (c) pins and/or fins are arranged within channel adjacent to the coolant port (specifically its outlet) so as to cause liquid coolant entering the at least one channel to flow in all directions in a plane parallel to the surface (and/or a bottom surface of the channel). With reference to (c), the coolant port is arranged with respect to the pins and/or fins to promote omnidirectional or radial jetted flow of liquid coolant, for instance. Each of these may promote the flow of coolant within the channel (or channels), particularly towards a second coolant port (acting as an external outlet for the cold plate). In this way, a pressure drop may be reduced or minimised.

All aspects may mount the cold plate onto the heat producing chip or component (electronic device) in the same, or similar method as current air cooled heatsinks. By retrofitting the cold plate onto the same mounting points, it may allow easier adoption of the product into existing hardware.

In any aspect, pins and/or fins are advantageously arranged within the channel or channels (and indeed, may define multiple channels in some embodiments). The pins and/or fins may extend from a bottom surface of the channel and more preferably extend to a top surface of the channel (opposite the bottom surface). The pins and/or fins may be arranged within part or all of the channel, but particularly around the coolant port (or coolant ports).

In preferred embodiments, the pins and/or fins are arranged in a regular, uniformly distributed pattern and/or so as to prevent unobstructed flow of liquid coolant between a coolant port acting as a coolant inlet and a coolant port acting as a coolant outlet. Such an arrangement (or arrangements) may be provided throughout the channel or the arrangement may vary, with such an arrangement being provided around the coolant port (or coolant ports) and a different arrangement of pins and/or fins being provided in an intermediate portion of the channel (for instance, the intermediate portion of the channel having fins that permit unobstructed flow between the inlet and outlet ports, for instance using fins only). The channel width in this intermediate portion of the channel may be smaller than around the ports.

In some embodiments, the pins and/or fins are spaced apart by at least 1 mm to 8 mm and more preferably between 3 mm and 5 mm and most preferably 3.5 mm to 4.5 mm (measured from pin centre to pin centre). In embodiments, the pins and/or fins are spaced apart by between 1.5 (or 2) and 3 times a pin diameter (or fin width) and more preferably between 2 and 2.5 times a pin diameter (again measured from pin centre to pin centre). The diameter of a pin or width of a fin may be between 1 mm and 3 mm and more preferably around 2 mm. Such configurations may provide low (or reduced) pressure drop across the cold plate and/or mitigate a risk of fouling from liquid-based contaminants and growths.

In embodiments, a heat pipe or vapour chamber may be provided within the housing of the cold plate between the thermal interface surface and the channel. This may increase (or maximise) the effective conduction or spreading to the inlet and outlet (exhaust) regions from the central heat flux area of a given chip or IC.

The cold plate may form part of an electronics module, such a computer system or server, which may comprise a module housing (such as a server chassis), with an electronic device mounted within the module housing. The electronic device may comprise one or more chips or ICs, for instance mounted on a PCB (and indeed, the electronic device may comprise a portion of or the whole PCB). The cold plate is mounted on the electronic device, such that heat generated by the electronic device is transferred through the thermal interface of the cold plate. The module housing can have an opening, such that one or more pipes coupled to the coolant port of the cold plate can pass through the opening, to allow liquid coolant to flow between interior and exterior the module housing.

The module housing is typically substantially planar (for example, have an elongated cuboid shape) and may define a height dimension (Z) perpendicular to the plane of the housing (generally 1 rack unit or approximately 44 mm to 45 mm). The combined size of the electronic device and cold plate in the height dimension typically fills the housing, generally being at least 80%, 85%, 90% or 95% of a size of the module housing in the height dimension. In other words, the Z height of the assembly of the cold plate fits within a 1U server chassis when attached to a heat producing component (although a server chassis larger than 1U may be used in cases). The described cold plate can vary in its overall size. This may depend on the socket type that it is attached to (fixture points), and the thermal cooling capacity required from the cold plate. The cold plates can perform the same as air cooled heat sinks but usually within a reduced Z height of the air cooled heatsink it will replace.

Multiple electronic devices may be provided inside the module housing (for instance, multiple chips or ICs on the same PCB or on different PCBs). Then, more than one cold plate may be used to cool the multiple devices, with each cold plate being thermally coupled to at least one electronic device.

A piping arrangement is advantageously coupled to the coolant ports of each of the cold plates for transferring liquid coolant to and from the respective cold plates. The piping arrangement is preferably arranged to transfer liquid coolant to and from the cold plates in series or in parallel. It is possible for some cold plates to be connected in series and others to be connected in parallel in different arrangements (for example, in a combination of series and parallel couplings). This may be made easier by the rotation of the coolant port (using a swivel joint).

An electronics or server system may also be provided, comprising a plurality of electronics modules (for example, servers), each of which is in accordance with an embodiment described herein. A piping network may be configured to transfer liquid coolant to and from each of the electronics modules. A heat exchanger arrangement may then be used to receive liquid coolant from each of the electronics modules through the piping network, transfer heat from the received liquid coolant to at least one heat sink (which may be air or liquid, for example). The heat exchanger may thereby cool the liquid coolant thereby. The cooled liquid coolant may then be directed to the plurality of electronics modules (for instance, in a closed loop way). The piping network may transfer liquid coolant to and from the plurality of electronics modules in series or in parallel (or in a combination of series and parallel couplings).

The electronics modules (especially, when each is a server, for instance a blade server) may be arranged in one or more racks and preferably multiple racks. Each rack may hold 42 such modules. A single pump may then be able to pump all liquid coolant within the piping network to all of the modules (which may fill multiple racks, such that at least 43 modules are provided). Each module may have at least one cold plate (and preferably multiple cold plates) receiving liquid coolant.

BRIEF DESCRIPTION OF THE DRAWINGS

The disclosure may be put into practice in a number of ways and preferred embodiments will now be described by way of example only and with reference to the accompanying drawings, in which:

FIG. 8A depicts a top internal view of a cold plate in accordance with an embodiment of the disclosure;

FIG. 8B shows a side view of the embodiment of FIG. 8A;

FIG. 9 illustrates an enlarged portion of FIG. 8A, with additional detail;

FIG. 10A depicts the top internal view of FIG. 8A with additional detail regarding coolant flow;

FIG. 10B depicts a top internal view of a variant to the embodiment of FIG. 8A with additional detail regarding coolant flow;

FIG. 11A shows an internal cross-sectional view of a cold plate according to a first further embodiment;

FIG. 11B illustrates a perspective view of a bottom of the embodiment of FIG. 11A;

FIG. 11C depicts a bottom view of the embodiment of FIG. 11A;

FIG. 12A shows an internal cross-sectional view of a cold plate according to a second further embodiment;

FIG. 12B illustrates a perspective view of a bottom of the embodiment of FIG. 12A;

FIG. 12C depicts a bottom view of the embodiment of FIG. 12A;

DETAILED DESCRIPTION OF PREFERRED EMBODIMENTS

Figure 1:
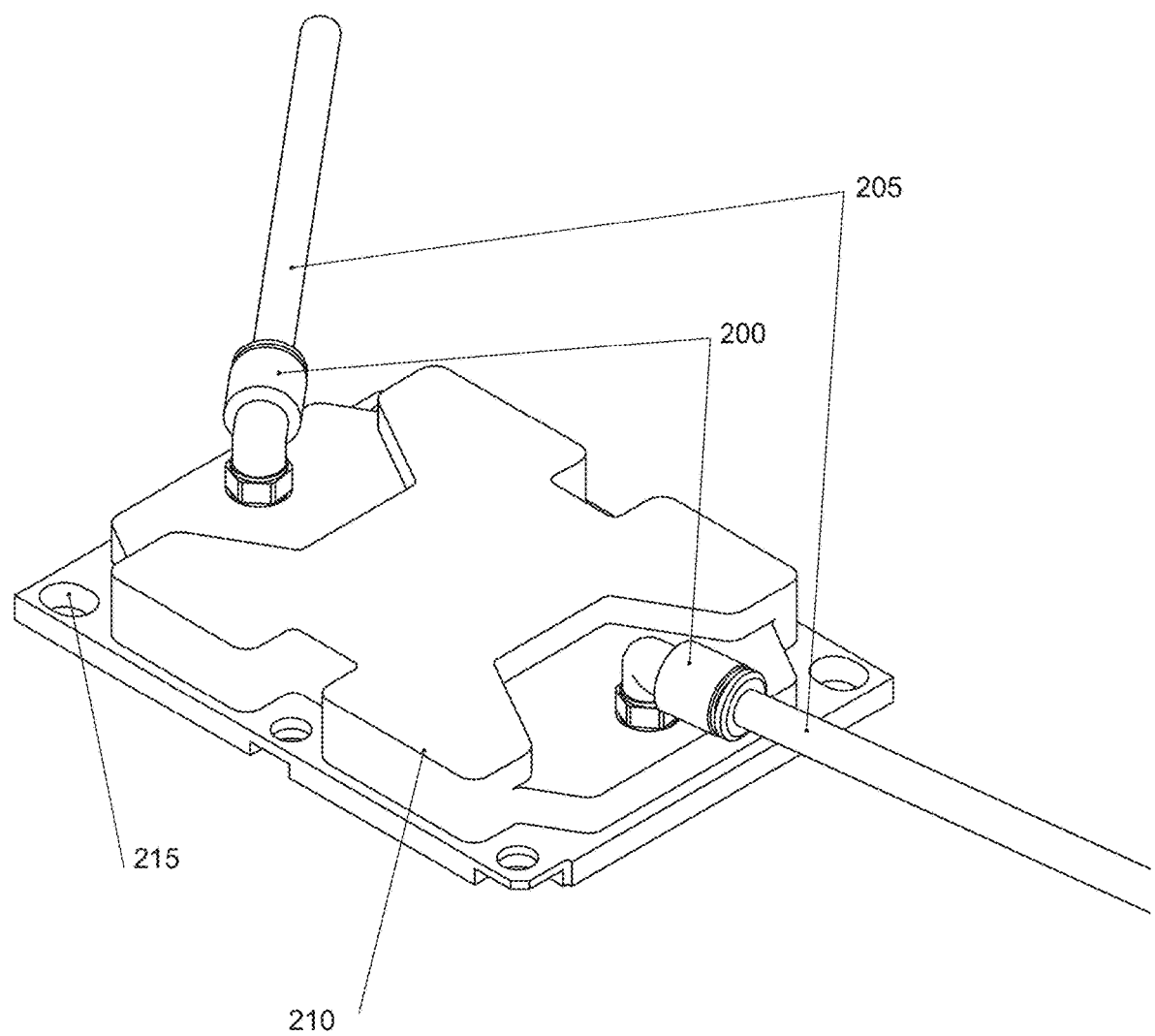
FIG. 1 schematically shows an embodiment of a cold plate according to the disclosure.

Referring first to FIG. 1, there is schematically shown an embodiment of a cold plate (or cold plate assembly) according to the disclosure. This is advantageously for use in a server blade (or similar module), as will be discussed below. The cold plate assembly comprises: a cold plate 210 (preferably made integrally); swivelling elbow connections 200; and inlet/outlet tubes 205. Also shown are fixture points 215 on the cold plate 210. These fixture points beneficially replicate the ones found on air cooled heatsinks that the cold plate can replace. The swivelling elbow connections (or swivel joints) 200 are especially useful in configuring the cold plate assembly for operation, as will now be explained.

The top surface of the cold plate 210 is recessed around the swivelling elbow connections 200, such that the height of the cold plate 210 in the recessed regions is lower than in the central portion of the top surface. This further allows freedom of rotation for the swivel joints 200.

Figure 2A:
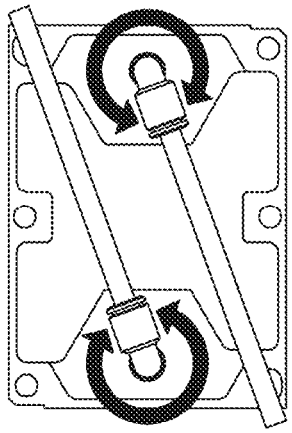
FIG. 2A shows a top view of the embodiment of FIG. 1 in a first configuration.

With reference to FIG. 2A, there is shown a top view of the embodiment of FIG. 1 in a first configuration. The rotation of the swivelling elbow connections 200 can be seen, especially with respect to the recessed portions of the top surface, having a generally hexagonal shape in plan view. In this example, it will be noted that the inlet and outlet hoses/tubes 205 can cross the body of the cold plate without interference.

Figure 2B:
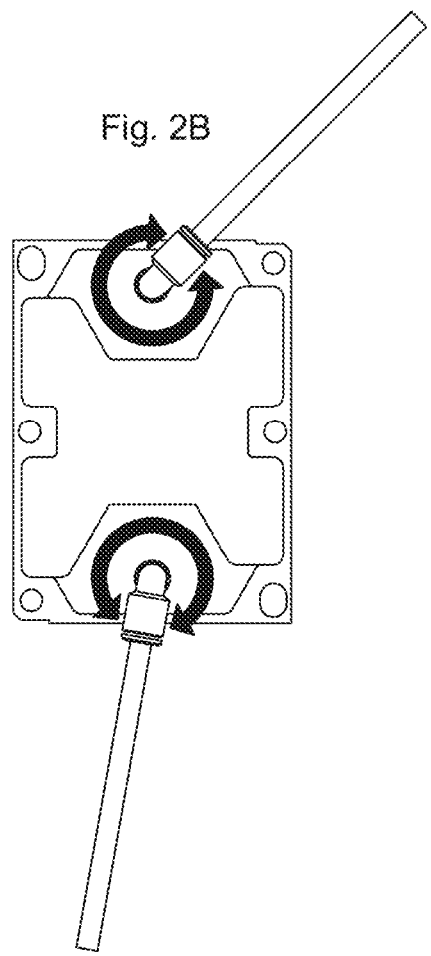
FIG. 2B shows a top view of the embodiment of FIG. 1 in a second configuration.

With reference to FIG. 2B, there is shown a top view of the embodiment of FIG. 1 in a second configuration. In this illustration, the inlet and outlet hoses/tubes 205 face away from the cold plate body 210 in arbitrary directions. Again, this is permitted by the recessed portions of the top surface as well as the swivelling elbow connectors 200.

In general terms, there may therefore be considered a cold plate, comprising a housing (which may be integrally formed), a surface of the housing (typically planar) being arranged to provide a thermal interface (which may be termed a conduction surface) for cooling an electronic device thermally coupled thereto. The cold plate further comprises at least one channel within the housing and proximate to the surface. The channel or channels may be formed of an internal chamber (or chambers), volume or other space for containing liquid coolant (such as water, a water-based coolant, a coolant that essentially comprises water or a high specific-heat capacity liquid alternative). The channel or channels are arranged for the liquid coolant to flow therethough, such that heat received by the thermal interface is transferred to the liquid coolant. Optionally, a plurality of parallel channels may be provided, each extending from the coolant port. As will be discussed further below, pins and/or fins are preferably arranged within the at least one channel.

The cold plate also comprises a coolant port extending outside the housing, for transferring liquid coolant to and/or from the at least one channel. The coolant port may be a connector, coupling, joint or other similar structure. At least one pipe, hose or tube (preferably flexible) may be coupled to the coolant port for transferring liquid coolant to and/or from the coolant port. Advantageously, the cold plate is configured such that the liquid coolant remains substantially in a liquid state (that is, single phase liquid cooling).

In one aspect of the disclosure, the coolant port comprises an independent rotating fluid connector, which may be in the form of a swivel joint (or swivel elbow connector, all these terms being used synonymously herein) thereby allowing adjustment in the direction of a pipe coupled to the coolant port. The independent rotating fluid connector or swivel joint may increase flexibility of placement of the cold plate. This may allow retro-fitting of the cold plate to an existing electronic unit, such as a server or other computer system, without the need to make any other changes to the unit or system. The cold plate may be configured to fit in place of an air-cooled heat sink, for example.

Preferably, the surface arranged to provide the thermal interface is a bottom surface of the housing. Then, the coolant port is advantageously provided on a top surface of the housing, opposite the bottom surface. In preferred embodiments, the coolant port extends in a direction perpendicular to the top surface of the housing (for instance in a first part). The swivel joint may then extend the coolant port in a different direction (a second part, for example), typically more parallel or generally parallel to the top surface of the housing. This may be termed an elbow shape, for example with a curved portion between the first and second parts. Beneficially, the swivel joint allows the direction of the pipe to be adjusted around an axis perpendicular to the top surface of the housing. In particular, the swivel joint may allow the direction of the pipe to be adjusted through at least 90 degrees, 180 degrees, 270 degrees and preferably up to (and including) 360 degrees, especially around an axis perpendicular to the top surface of the housing. Thus, the swivel connector may allow full rotation freedom for the coolant port.

The top surface of the housing may be configured (for example in respect of its height and/or shape) to allow adjustment in the direction of a pipe coupled to the coolant port. In particular, the height and/or shape of the top surface may be different in a portion around the coolant port from a height and/or shape in other parts of the top surface of the housing (especially in the case of two coolant ports, in a central section of the top surface between the top coolant ports), so as to allow adjustment in the direction of a pipe coupled to the coolant port. In this context, the term height may refer to the distance between the bottom surface and top surface (in a direction perpendicular to the bottom surface, which is typically planar). The difference in height may reflect the shape and dimensions of the coolant port, for instance as discussed below.

The preferred embodiment has a top surface with a height that is smaller around the coolant port than away from the coolant port. Where, as discussed above, the coolant port has an elbow shape (such that a first part extends in a direction generally perpendicular to the top surface and a second part extends in a direction generally parallel to the top surface), the height difference may be approximately the length of the portion of the coolant port extending from the top surface of the cold plate housing to the base or bottom of the elbow shape (that is, where a transition from the first part to the second part begins, such as the base of the curved portion).

In principle, a single coolant port could provide both an inlet for liquid coolant to the channel and an outlet for liquid coolant from the channel. In the preferred embodiment, multiple coolant ports are used. Then, the coolant port is a first coolant port for transferring liquid coolant to the at least one channel. The cold plate may comprise a second coolant port for transferring liquid coolant from the at least one channel. Any features described with reference to a single coolant port herein may be applied to any of multiple coolant ports. In embodiments, the housing is elongated and the first and second coolant ports are located at opposite ends of the housing along the direction of elongation, which may promote flow of liquid coolant across the thermal interface surface and/or aid flexible placement of the cold plate. Additionally or alternatively, the second coolant port may (like the first coolant port) comprise a swivel joint thereby allowing adjustment in the direction of a pipe coupled to the second coolant port. Providing two coolant ports, each with swivel joints, may allow improved ways of coupling the cold plate, including the potential to couple cold plates together.

Figure 3A:
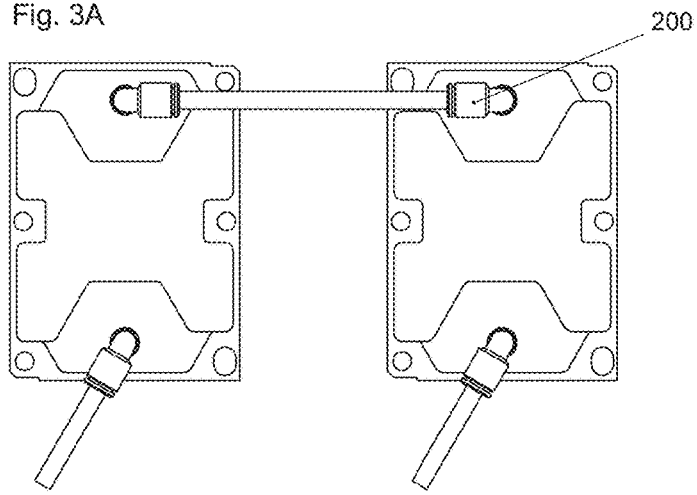
FIG. 3A shows a top view of two coupled cold plates according to the embodiment of FIG. 1 in a first series configuration.
Figure 3B:
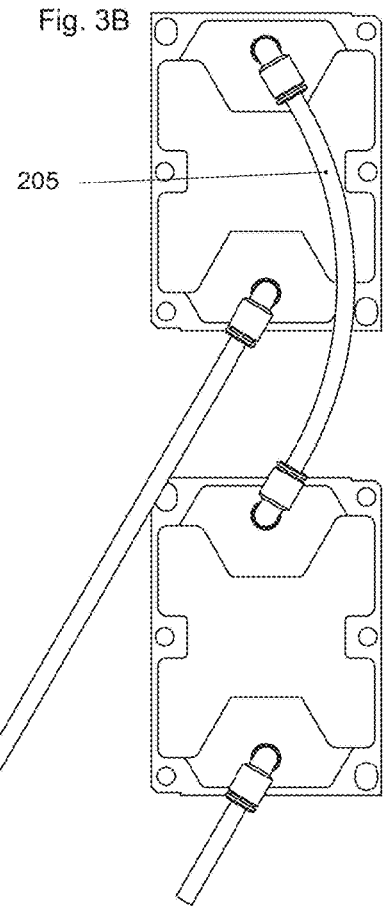
FIG. 3B shows a top view of two coupled cold plates according to the embodiment of FIG. 1 in a second series configuration.
Figure 3C:
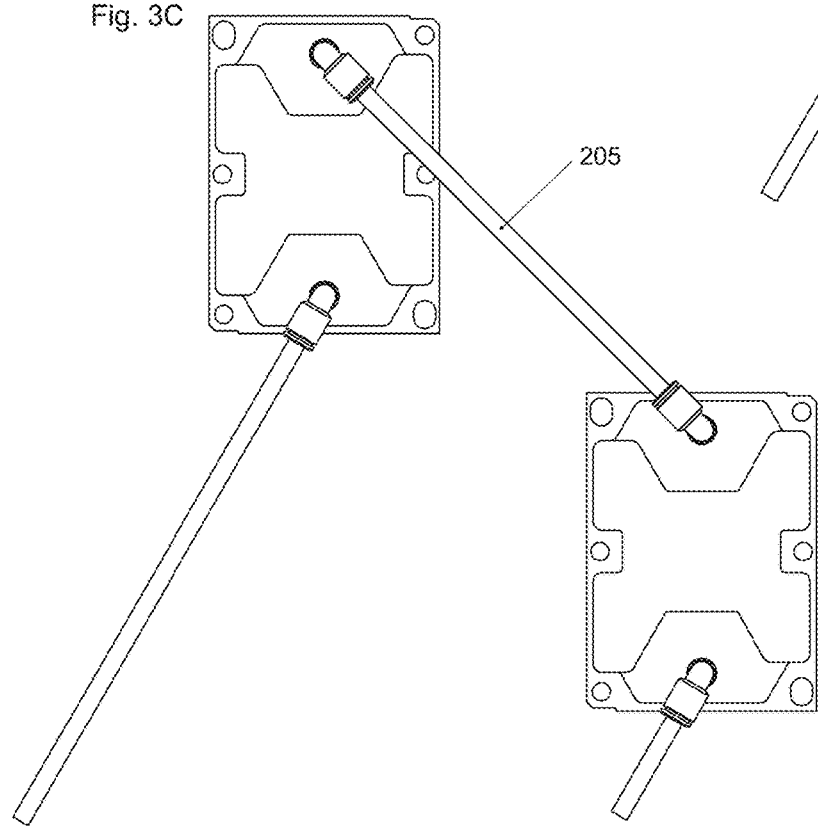
FIG. 3C shows a top view of two coupled cold plates according to the embodiment of FIG. 1 in a third series configuration.

Another key advantage of this structure is the ability to use multiple such cold plates together. With reference to FIG. 3A, there is shown a top view of two coupled cold plates according to the embodiment of FIG. 1 in a first series configuration. Here, the cold plates are positioned horizontally to each other, the swivelling elbow connections 200 are adjusted accordingly and a tube/hose 205 connects the two. Referring to FIG. 3B, there is shown a top view of two coupled cold plates according to the embodiment of FIG. 1 in a second series configuration. The cold plates are positioned vertically to each other. The swivelling elbow connections 200 allow the tube/hose 205 to curve around another swivelling connector in the way. Referring to FIG. 3C, there is shown a top view of two coupled cold plates according to the embodiment of FIG. 1 in a third series configuration. Here, the cold plates are positioned diagonally to each other. The swivelling elbow connectors 200 are at a 45-degree angle to each other with a tube/hose 205 connecting the two.

Figure 4A:
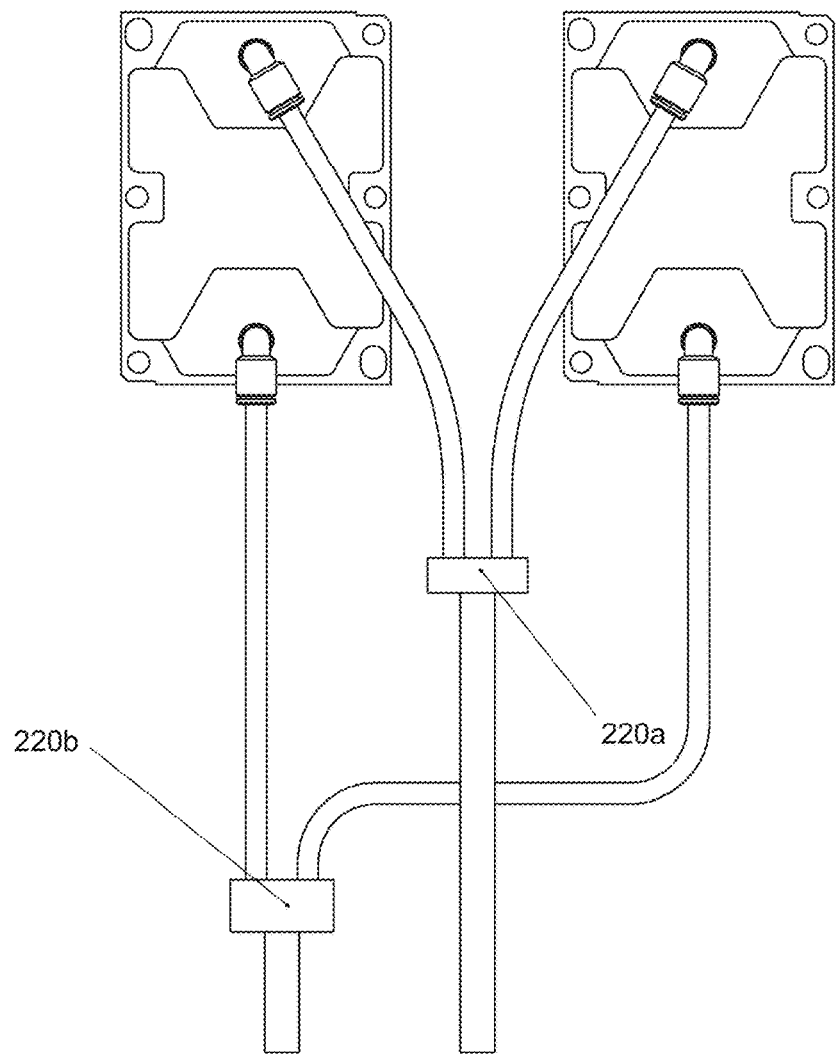
FIG. 4A shows a top view of two coupled cold plates according to the embodiment of FIG. 1 in a parallel configuration.

Next, reference is made to FIG. 4A, which shows a top view of two coupled cold plates according to the embodiment of FIG. 1 in a parallel configuration or parallel feed. An inlet to the cold plates 220a is split to feed the cold plates in parallel. An outlet 220b joins back up after being split to feed the cold plates in parallel.

With reference to the general terms used herein, the electronic device may be a first electronic device and the cold plate may be a first cold plate. Then, a second electronic device may be provided. In that case, a second cold plate (of any type) as herein disclosed may be mounted on the second electronic device, such that heat generated by the second electronic device is transferred through the thermal interface of the second cold plate. Then, a piping arrangement is advantageously coupled to the coolant port of the first cold plate and to the coolant port of the second cold plate for transferring liquid coolant to and from the first cold plate and to and from the second cold plate. In preferred embodiments, the piping arrangement is configured to transfer liquid coolant to and from the first cold plate and to and from the second cold plate either in series or in parallel.

Figure 4B:
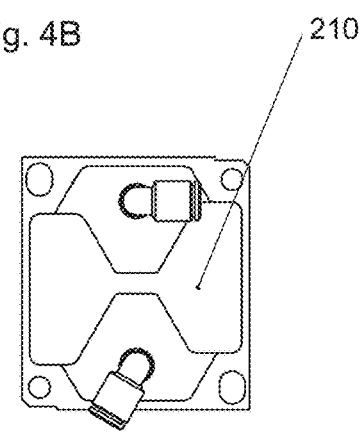
FIG. 4B shows a top view of a cold plate according to a first variant of the embodiment of FIG. 1.
Figure 4C:
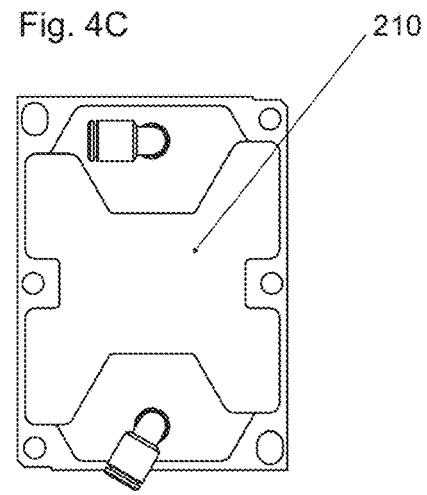
FIG. 4C shows a top view of a cold plate according to a second variant of the embodiment of FIG. 1.

The size of the cold plate can match that of the component or device being cooled. Referring next to FIG. 4B, there is shown a top view of a cold plate according to a first variant of the embodiment of FIG. 1. This is a smaller cold plate for cooling smaller components. Referring to FIG. 4C, there is shown a top view of a cold plate according to a second variant of the embodiment of FIG. 1. This is a larger size cold plate for cooling larger size components.

Figure 5:
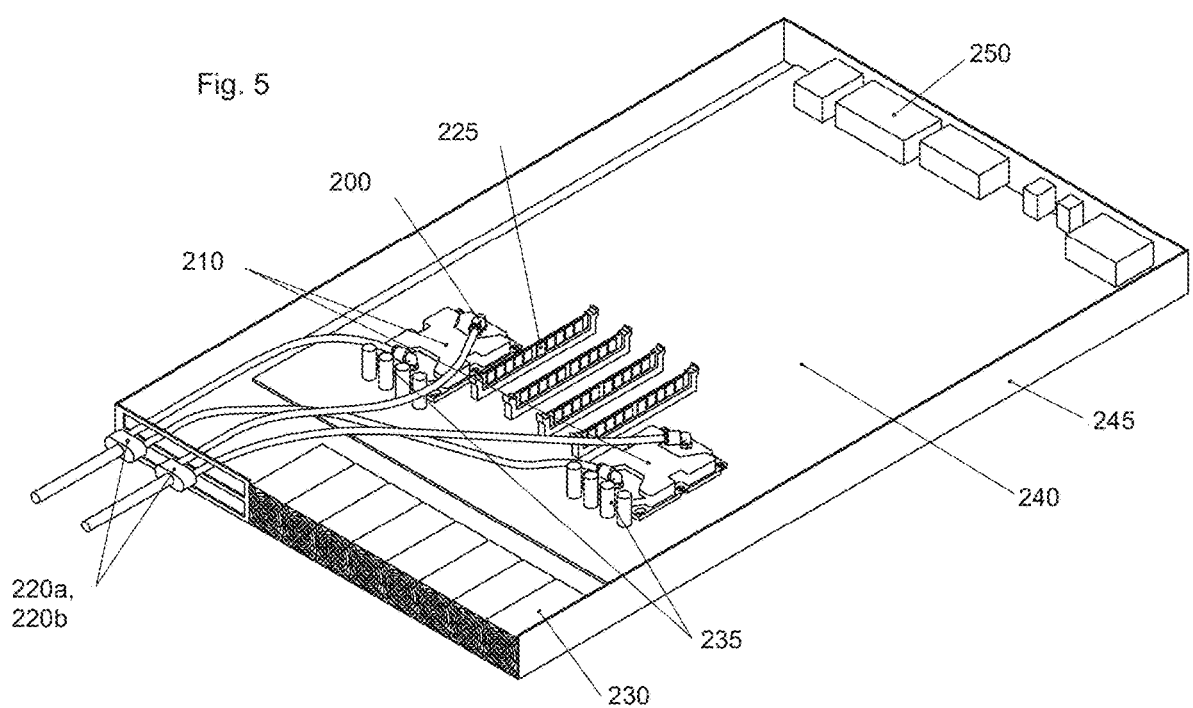
FIG. 5 depicts a perspective view of an example blade server with cold plates mounted within.

Reference is now made to FIG. 5, which depicts a perspective view of an example blade server with cold plates mounted within. Where the same features are shown as depicted in other drawings, identical reference numerals have been used. In this example, a 1RU server chassis 245 is shown, with a set of two cold plates 210 on a PCB 240 (a motherboard) within the 1 RU server chassis 245. On the PCB 240, there are other components such as RAM sticks 225 (shown here in a row), capacitors 235 (also shown in rows) and I/O connectors (not shown). Fans 230 are provided at the back of the server chassis 245 that remove the heat from the chassis 245, as is normal in existing such units. I/O 250 is provided at the front of the board. These components can be USB, QSFP, Ethernet ports, etc.

As can be seen, the swivel nozzle 200 on the cold plate 210 can be rotated to allow the tube/hose to be best directed around existing components such as the RAM 225 and capacitors 235. The inlet and outlet tubes as shown at 220a and 220b, come through an existing aperture in the server chassis 245, for example a PCIE card slot as shown.

Figure 6:
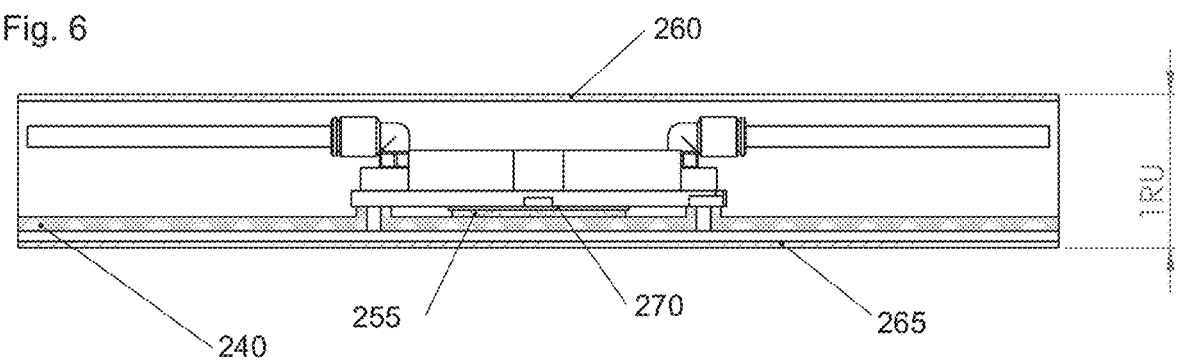
FIG. 6 illustrates a side view of the embodiment of FIG. 5.

Referring now to FIG. 6, there is illustrated a side view of the embodiment of FIG. 5. The cold plate is attached to the PCB (for example, motherboard) 240 on top of a heat producing chip. It also illustrates that the cold plate fits within a 1RU server height. The base 265 of the chassis 245 is shown with the PCB 240 mounted thereon. The heat producing chip 255 that the cold plate 210 is cooling is on the PCB 240 and between the heat producing chip 255 and the cold plate 210 is a thermal interface material (TIM) 270, such as a Gap Pad or thermal paste. The distance between the chassis lid 260 and the chassis base 265 is shown as 1 RU.

Figure 7:
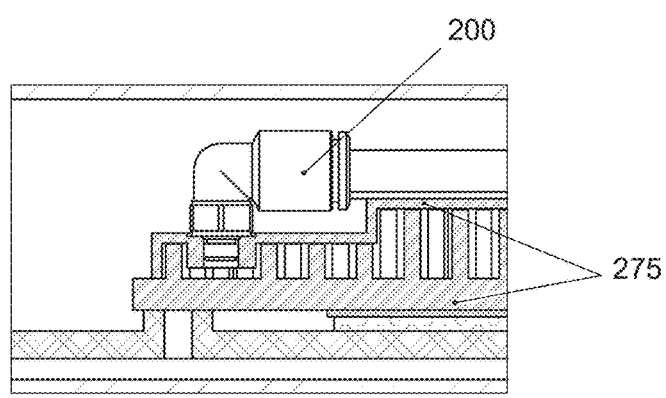
FIG. 7 shows an enlarged portion of FIG. 6 with internal details of the cold plate schematically depicted.

Now referring to FIG. 7, there is shown an enlarged portion of FIG. 6 (specifically its left side) with internal details of the cold plate schematically depicted in section. In this example, the swivel nozzle 200 is attached to the cold plate on a lower section so that the assembly can fit within a 1 RU server chassis. The nozzle 200 points back over the cold plate, for ease of illustration. Pins 275 are provided inside the cold plate, the pins 275 having two different height sections. The pins 275 promote thermal transfer. Placement of the inlet port and the exhaust port at the ends of the cold plate module may result in reduced height of the pins 275.

Thus, another generalised aspect of the disclosure may consider an electronics module (such as a computer and/or server module or unit, for instance a server blade). The electronics module may comprise: a module housing (such as a server chassis); an electronic device mounted within the module housing (which may comprise one or more chips or ICs, for example mounted on a PCB, such as part of a computer server); and a cold plate as disclosed herein mounted on the electronic device. In this way, heat generated by the electronic device may be transferred through the thermal interface of the cold plate. If the electronic device is mounted on a PCB, the cold plate may also be affixed to the PCB (using screws, bolts or similar fixings, for instance), for structural and/or thermal connection between the thermal interface surface of the cold plate and a heat radiating surface of the electronic device.

Preferably, a pipe (or tube or hose) is coupled to the coolant port of the cold plate for transferring liquid coolant to and/or from the coolant port. In preferred embodiments, the module housing comprises an opening (for instance, for allow interfacing or wire-based communication with the electronic device or ancillary components, such as a daughter-card slot or peripheral connection opening). Then, the pipe may pass through the opening, such that liquid coolant flows (to and/or from) exterior the module housing, as well as inside the module housing (although typically only within the pipe and cold plate).

The cold plate typically fits within a standard module housing, in particular such a server chassis. The module housing may be substantially planar (for example in the case of a server blade). In that case, the module housing may define a height dimension perpendicular to the plane of the housing, for example 1 rack unit (44 mm to 45 mm, more specifically approximately 44.45 mm or 1.75 inches). A combined size of the electronic device and cold plate in the height dimension is advantageously at least 80% (or 85%, 90% or 95) of a size of the module housing in the height dimension.

In preferred embodiments, a second electronic device is mounted within the module housing and a second cold plate (of any type disclosed herein) is mounted on the second electronic device, such that heat generated by the second electronic device is transferred through the thermal interface of the second cold plate.

Other aspects of a cold plate in accordance with the disclosure will now be discussed. In particular, aspects will be considered that result in the cold plate providing a low back pressure. With reference to FIG. 8A, there is depicted a top internal (plan) view of an example cold plate in accordance with an embodiment of the disclosure. In this drawing, the lid and nozzles are removed for clarity. A first feature that has been identified to reduce the back pressure is the provision of inlet and exhaust ports on the cold plate that are perpendicular to its bottom and/or top surface. This has been found to increase (and potentially maximise) omnidirectional flow at inlet and exhaust regions of the internal volume (channel) of the cold plate.

Shown in FIG. 8A are: coolant inlet port 104; coolant outlet or exhaust port 105; coolant flow channel 106; and pins 109. This configuration distributes coolant flow 106 in all directions, allowing coolant to spread evenly across the cold plate. In existing cold plates, coolant would be distributed through channels and baffles, increasing pressure drop.

A second feature reducing back pressure is having the inlet port 104 and exhaust port 105 aligned over an internal pin/fin arrangement 109. This may also promote omnidirectional or radial jetted flow 106 at fluid entry and exit discharge points inside the cold plate module.

Referring to FIG. 8B, there is shown a side (sectional) view of the embodiment of FIG. 8A, with nozzles 108, cold plate base 111 and cold plate lid 112 included. This illustrates a third advantageous feature of the embodiment, in which the sectional area 107 between the outlet of nozzle 108 and the cold plate base 111 is equal to or larger than the section area of the nozzle 108 and hose. The effect of this is maximise effective cross-sectional area to reduce (or minimize) the pressure drop.

Also illustrated is a fourth advantageous feature, in which the pins 109 are connected to the base 111 and lid 112. This may ensure that no flow 106 can short-cut or bypass the pins 109. In this way, the pins 109 can direct the coolant flow 106 within the cold plate, as will now be discussed.

Now referring to FIG. 9, there is illustrated an enlarged portion of FIG. 8A, with additional detail. This illustrates a fifth advantageous feature, in which the pins (and/or fins) 109 are non-directional and allow the natural radial flow from the perpendicular inlet and exhaust ports. It also illustrates a sixth advantageous feature, in which there is no line-of-sight through the pins, as shown by flow line 110. This may encourages a non-linear flow and/or promote radial flow. This may reduce the pressure drop as well. For instance, the pins may be formed in offset rows or with tessellated triangular spacings. In such configurations, the angles of a triangle formed between the centres of three adjacent pins (two in one row and a third in an adjacent parallel row, in an intervening column) may each be 60 degrees.

A seventh advantageous feature is also inferred from this drawing, specifically that the spacing between pins and/or fins 109 can be set to promote coolant flow and mitigate risk of fouling from liquid-side contaminants and growth. Such a gap or spacing thereby reduces (or minimises) pressure drop across the cold plate, whilst still promoting radial flow and providing low thermal resistance (promoting heat transfer thereby). A spacing (measured between pin or fin centres) of between 1.5 (or 1.75) and 3 times the pin or fin diameter and more preferably between 2 and 2.5 times the pin diameter has been found to be advantageous. A pin or fin diameter of between 1.5 mm and 3 mm (more typically around 2 mm) has been used in embodiments. In practice, the gap between pins (measured from pin edge or flat to adjacent pin edge or flat) may be between 1 mm to 4 mm or more preferably between 1.75 mm or 2 mm to 3 mm, particularly for pins having a 2 mm to 2.3 mm diameter. It should be noted that the pins may not be circular in cross-section; for example, they may have a hexagonal cross-section.

Although seven advantageous features and synergistic benefits can be seen through the combination of multiple ones of these advantageous features, they can be employed individually or in any combination.

Thus, a further generalised aspect of the disclosure may consider a cold plate of any type as disclosed herein with a configuration to provide a low pressure drop. In embodiments, the coolant port is configured to cause liquid coolant to enter and/or exit the at least one channel in a direction perpendicular to the surface or the coolant port is arranged with respect to the pins and/or fins to promote omnidirectional or radial jetted flow of liquid coolant.

Embodiments may define that a cross-sectional area of an outlet from the coolant port to the at least one channel is no larger than a cross-sectional area of the at least one channel at the outlet.

Some embodiments may include that pins and/or fins are arranged within the at least one channel adjacent to the coolant port so as to cause liquid coolant entering the at least one channel to flow in all directions in a plane parallel to the surface.

In embodiments, the pins and/or fins are arranged to extend from a bottom surface of the at least one channel that is proximate the surface of the housing arranged to provide the thermal interface. Preferably, the pins and/or fins are arranged to extend to a top surface of the at least one channel that is distal the surface of the housing arranged to provide the thermal interface.

Where multiple coolant ports are provided, pins and/or fins are advantageously arranged within the at least one channel, at least adjacent to the first coolant port and/or the second coolant port. In such regions, the pins and/or fins may be arranged in a regular, uniformly distributed pattern and/or so as to prevent unobstructed flow of liquid coolant between the coolant port and the second coolant port. For instance offset, uniformly spaced rows of pins may be provided.

In certain embodiments, the pins and/or fins are arranged in a regular, uniformly distributed pattern throughout the at least one channel. Alternatively, the pins and/or fins may be arranged in a first pattern in a first portion of the at least one channel, adjacent to the first and/or second coolant port. Then, the pins and/or fins may be arranged in a second, different pattern in a second portion of the at least one channel, spaced apart from the first and/or second coolant port. For instance, the first pattern may consist of pins and the second pattern may consist of fins. The channel (which may be defined by the internal volume, without accounting for the pins or fins) may be wider in the first portion than in the second portion. Optionally, the first pattern is configured so as to prevent unobstructed flow of liquid coolant between the first coolant port and the second coolant port and the second pattern is configured to allow unobstructed flow of liquid coolant between the first coolant port and the second coolant port (for instance by using linearly configured or straight fins). The first portion of the at least one channel may be adjacent the first coolant port, with the pins and/or fins also being arranged in the first pattern (or a pattern having a similar effect) in a third portion of the at least one channel, adjacent the second coolant port. The second portion of the at least one channel may then be between the first portion and the third portion.

Specific embodiments may provide the pins and/or fins spaced apart (measured from pin or fin centre to adjacent pin or fin centre) by at least 1.75 or 2 times a diameter of a pin or a width of a fin and up to 2.5 or 3 times a diameter of a pin or a width of a fin. For example, the gap between pins (measured from pin edge to adjacent pin edge) may be between 1.5 mm to 4 mm or more preferably between 2 mm to 3 mm, for pins having a 2 mm diameter. Such spacing may promote coolant flow and mitigate risk of fouling from liquid-side contaminants and growth.

With reference to FIG. 10A, there is depicted the top (plan) internal view of FIG. 8A with additional detail regarding coolant flow. As can be seen, the pin/fin arrangement within the cold plate module at the region of the entry port and the exhaust port allows flow to radially discharge (that is, provide omnidirectional flow) 106. This may be attributed to the regular offset pin arrangement, as discussed above. However, a more linear and parallel flow region 113 is seen at a more central region within the cold plate module.

Since the flow within the central region is more linear, variations on the arrangement in this area may be provided without loss of performance. Referring to FIG. 10B, there is depicted a top internal view of a variant to the embodiment of FIG. 8A with additional detail regarding coolant flow. Here, fins 114 are provided in the more central, linear and/or parallel flow region.

The base of the cold plate may be enhanced to promote thermal transfer and improve performance. With reference to: FIG. 11A, there is shown an internal cross-sectional view of a cold plate according to a first further embodiment; FIG. 11B, there is illustrated a perspective (isometric) view of a bottom of the embodiment of FIG. 11A; and FIG. 11C, there is depicted a bottom (base) view of the embodiment of FIG. 11A. In this design, an embedded vapour chamber 115 is shown, increasing the effective conduction or spreading to the inlet and exhaust regions from the central heat flux area of a given chip.

With reference to: FIG. 12A, there is shown an internal cross-sectional view of a cold plate according to a second further embodiment; FIG. 12B, there is illustrated a perspective (isometric) view of a bottom of the embodiment of FIG. 12A; and FIG. 12C, there is depicted a bottom (base) view of the embodiment of FIG. 12A. Here, an embedded heat pipe 116 is shown, as an alternative way to increase the effective conduction or spreading to the inlet and exhaust regions from the central heat flux area of a given chip.

Figure 13A:
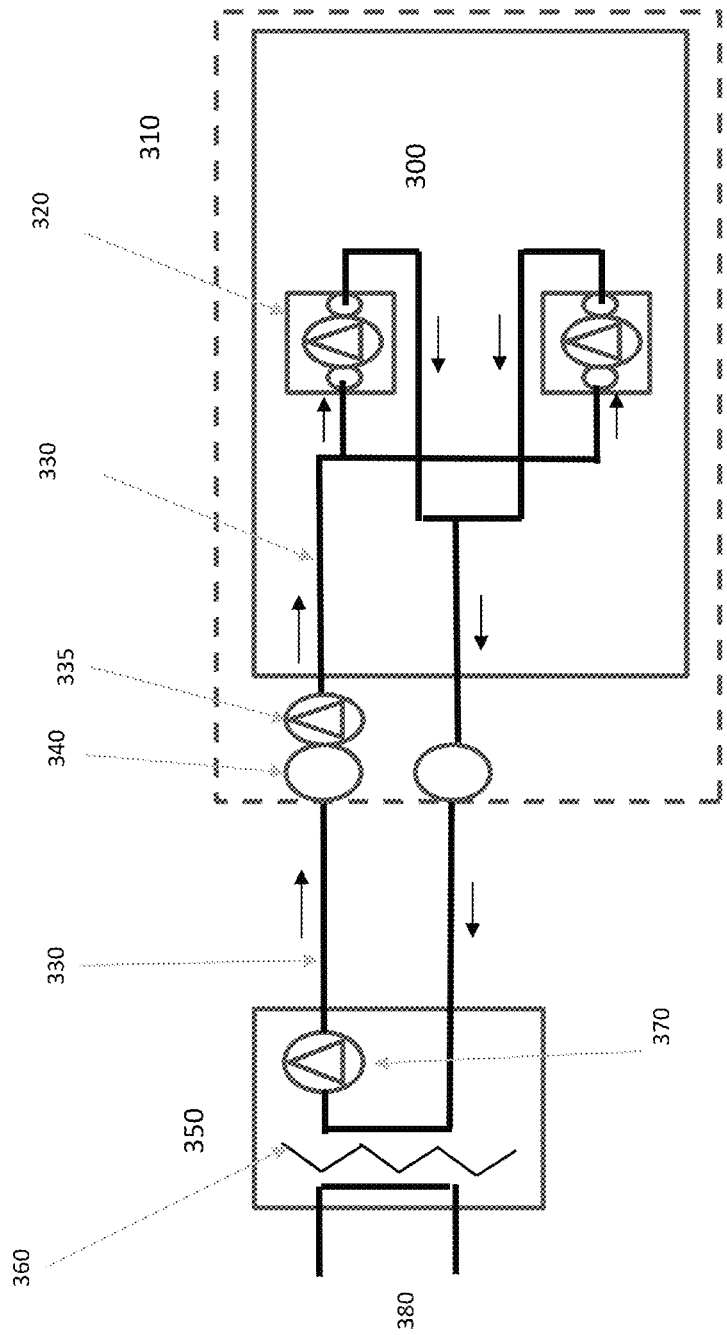
FIG. 13A shows a schematic view of an existing single rack server cooling system.

In general terms, it may be considered that the cold plate optionally further comprises a heat pipe or vapour chamber (advantageously within the housing) between the surface arranged to provide a thermal interface and the at least one channel. This may promote heat transfer across the thermal interface The advantages of reduced pressure drop will now be considered in more detail with reference to FIG. 13A, in which there is shown a schematic view of an existing single rack server cooling system. This comprises: a server chassis 300; a cold plate 320; a water-based cooling loop 330; a manifold 340; a cooling distribution unit (CDU) 350; and a heat sink 380. The server chassis may be mounted within a rack 310, with the manifold 340 being used to direct coolant to and from other servers (not shown). In such existing designs, multiple pumps are provided. An individual pump is provided within the cold plate 320 (that is, a pump at the level of the cold plate 320), which may assist in coolant distribution. A manifold-level pump 335 is also provided in many such designs. In addition, a facility-level pump 370 is used. The use of require local pumps is required to distribute coolant due to the high pressure drop within each cold plate. Such designs, in which the facility-level pump 370 is in the CDU 350 can also be described as a rack level CDU. The CDU 350 comprises a heat exchanger 360 for transferring heat to the heat sink 380. The heat sink 380 may be liquid-based or air-based depending on the facility, such as a further coolant loop comprising a heat rejection unit.

There are a range of disadvantages in using multiple pumps in this way. These include: multiple pumps add cost (in some examples there could be four integrated cold plate pumps per server chassis); each pump is a potential point of failure; each pump has an electrical power draw, adding to the total power draw; each pump will need to communicate to balance flow rate across the system, which adds complexity; the facility level pump 370 is still required to circulate facility coolant; and pump redundancy can only be added at the manifold-level pump 335 or at the level of the cold plate 320.

Figure 13B:
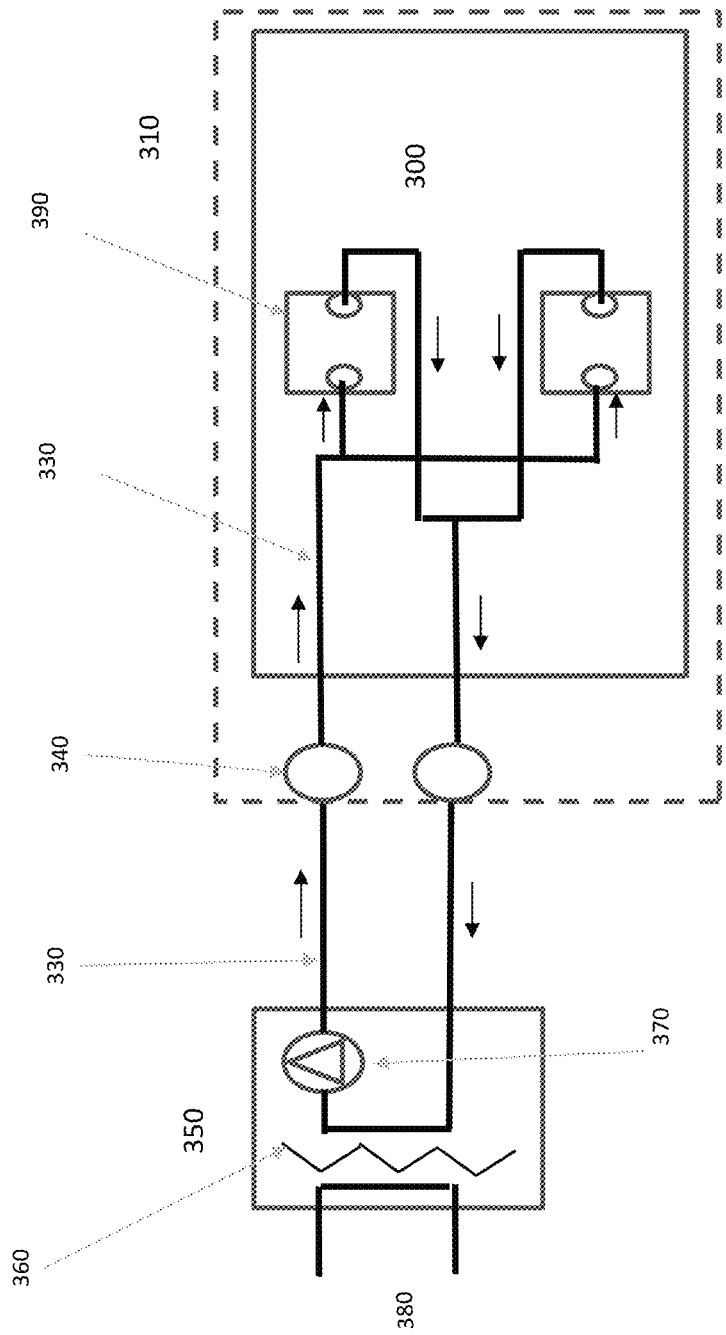
FIG. 13B shows a schematic view of a single rack server cooling system in accordance with the disclosure.

Reducing the pressure drop at each cold plate can allow the number of pumps to be significantly reduced with associated benefits. With reference to FIG. 13B, there is shown a schematic view of a single rack server cooling system in accordance with the disclosure. Where the same features are shown as in FIG. 13A, the same reference numerals are employed. A cold plate 390 is provided in accordance with the disclosure, having a lower pressure drop. In this case, only a facility level pump 370 is used to distribute coolant to all the cold plates 390 in the rack 310. The benefits include: all of the coolant is circulated by a single facility-level pump, typically within the CDU 350 (although this is not necessary), with no extra pumps required for normal operation; the coolant flow rate can be balanced through the design of the manifold 340; and adding pump redundancy in the facility cooling loop only requires one additional pump, which need not be operative during normal use. Further benefits will be appreciated in view of the above considerations.

Figure 14:
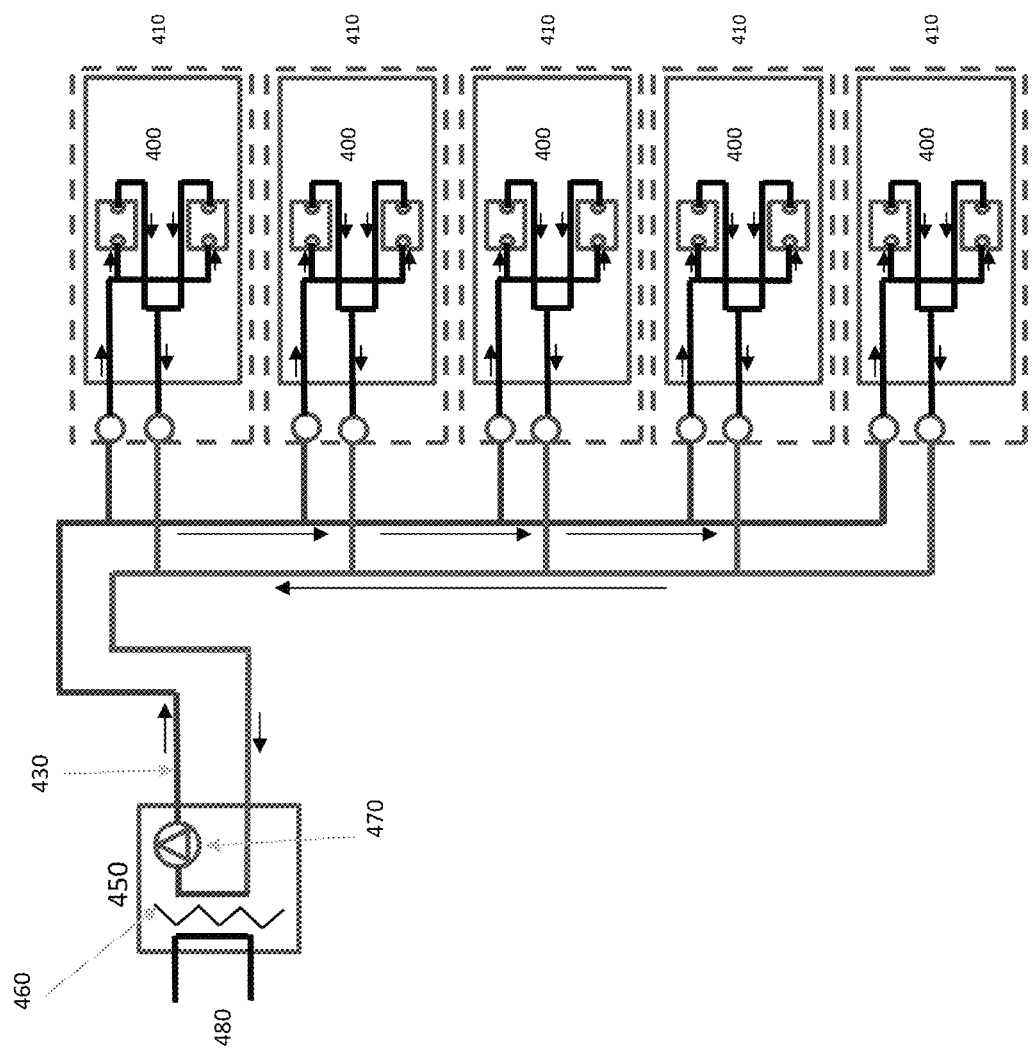
FIG. 14 shows a schematic view of a multi-server cooling system in accordance with the disclosure.

FIG. 14 shows a schematic view of a multi-server cooling system in accordance with the disclosure. This shows a server chassis 400 shown for each rack 410, with multiple such racks 410 being provided, each of which can house up to 42 server chassis 400. A water-based cooling loop 430 is provided across all racks, using a single CDU 450. The CDU 450 includes a heat exchanger 460 and a facility-level pump 470, with heat being transferred to a heat sink 480. Thus, a single pump 470 can be used in a system with hundreds of server chassis 400.

In summary, a range of benefits are provided by embodiments in accordance with the disclosure. These are particularly advantageous in a cold plate for cooling electronics cooling in dense applications (for example 1U sized servers in multiple racks) and ultra-dense applications Having inlet and exhaust ports perpendicular to the cold plate module may maximize omnidirectional flow at inlet and exhaust regions. Having inlet and exhaust ports located at the ends of the cold plate module may result in reduced required pin or fin height. Having the inlet and exhaust ports aligned over pin/fin arrangement may promote omnidirectional or radial jetted flow at fluid entry and exit discharge points inside the cold plate module (increasing or maximising effective cross-sectional area and/or reducing inlet and exhaust discharge pressure drop). Providing a pin/fin arrangement at entry and exhaust regions in the cold plate may allow coolant flow to discharge radially to a linear and parallel flow region towards the centre of the cold plate. Providing a large pin/fin effective gap or spacing may mitigate risk of fouling from liquid side contaminants and growth. Using an enhanced base for the cold plate with an embedded heat pipe or vapour chamber may increase (or maximise) the effective conduction or spreading to the inlet and exhaust regions from the central heat flux area of a given chip.

In a yet further aspect of the disclosure, there may be considered an electronics system comprising one or more electronics modules (such as blade servers or other computing units) and preferably a plurality of electronics modules, each of which is in accordance with the disclosure. In preferred embodiments, the plurality of electronics modules are arranged in multiple racks, with each rack optionally being able to hold up to 42 electronics modules. A piping network may be configured to transfer liquid coolant to and from each of the electronics modules. Then, a heat exchanger arrangement is advantageously arranged to receive liquid coolant from each of the electronics modules through the piping network and transfer heat from the received liquid coolant to at least one heat sink. This may cool the liquid coolant thereby. Then, the cooled liquid coolant may be directed (back) to the plurality of electronics modules. In other words, a closed loop may be provided for the liquid coolant across multiple cold plates. The piping network may be arranged to transfer liquid coolant to and from the plurality of electronics modules in series or (more preferably) in parallel. Advantageously, a single pump may be configured to pump all liquid coolant within the piping network (although redundancy may be provided, even if not needed for normal operation). This pump may be able to provide liquid coolant (without any other pumps in the system) to a large number of electronics modules, for instance at least 20, 40, 43 (i.e. two racks, at least one of which is full), 50, 100, 150, 200 or more. Such advantages may be possible through the use of cold plates in accordance with the disclosure.

Additional aspects of the disclosure may include a method of installing a cold plate according to the disclosure in an (already functioning) electronics module (such as a server). For example, the method may comprise fixing the cold plate to one or more electronic devices in the electronics module. In one embodiment, this may comprise fixing the cold plate in place of an air-cooled heatsink or replacing an air-cooled heatsink by the cold plate. In a further additional aspect, a method of operating an electronics system comprising multiple electronics modules, each of which having at least one cold plate, may be provided. The method may comprise pumping liquid coolant through the plurality of cold plates (in the same and/or different electronics modules) to cool one or more electronics device in each electronics module. Method steps corresponding (in respect of providing, installing, configuring, arranging, using, operating or similar) with any apparatus or structural features disclosed herein may also be considered.

Although specific embodiments have now been described, the skilled person will appreciate that various modifications and alternations are possible. For example, the structure and/or design of the cold plates may vary from that shown. Other shapes and applications are possible. For instance, a stepped bottom (thermal interface) surface may be used (having multiple parallel planes), although a planar surface is preferred.

All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A cold plate, comprising:
a housing, a surface of the housing being arranged to provide a thermal interface for cooling an electronic device thermally coupled thereto;
at least one channel within the housing and proximate to the surface, arranged for a liquid coolant to flow therethough such that heat received by the thermal interface is transferred to the liquid coolant;
a first coolant port for transferring liquid coolant to the at least one channel; and
a second coolant port for transferring liquid coolant from the at least one channel, wherein pins and/or fins are arranged within the at least one channel at least adjacent to but not underneath the first coolant port and/or the second coolant port such that liquid coolant entering the at least one channel flows in all directions in a plane parallel to the surface;
wherein:
(a) a cross-sectional area of an outlet from the coolant port to the at least one channel is no larger than a cross-sectional area between the outlet and a bottom surface of the at least one channel that is proximate the surface of the housing arranged to provide the thermal interface;
(b) the first coolant port is configured to cause liquid coolant to enter the at least one channel in a direction perpendicular to the surface and the second coolant port is configured to cause liquid coolant to exit the at least one channel in a direction perpendicular to the surface;
(c) the pins and/or fins are arranged within the at least one channel adjacent to the first coolant port and/or the second coolant port in a regular, uniformly distributed pattern and/or so as to prevent unobstructed flow of liquid coolant between the first coolant port and the second coolant port; and
(d) the pins and/or fins are arranged in a first pattern in a first portion of the at least one channel, adjacent to the first coolant port and/or second coolant port and in a second, different pattern in a second portion of the at least one channel, spaced apart from the first coolant port and/or second coolant port.

2. The cold plate of claim 1, wherein the pins and/or fins are arranged to extend from a bottom surface of the at least one channel that is proximate the surface of the housing arranged to provide the thermal interface to a top surface of the at least one channel that is distal the surface of the housing arranged to provide the thermal interface.

3. The cold plate of claim 1, wherein the pins and/or fins are spaced apart by at least 1.5 times a diameter of a pin or a width of a fin.

4. The cold plate of claim 1, wherein the housing is elongated and the first and second coolant ports are located at opposite ends of the housing along the direction of elongation.

5. The cold plate of claim 1, further comprising:
a heat pipe or vapour chamber within the housing between the surface arranged to provide a thermal interface and the at least one channel.

6. The cold plate of claim 1, wherein the at least one channel comprises a plurality of parallel channels, each of the parallel channels extending from the coolant port.

7. The cold plate of claim 1, wherein the cold plate is configured such that the liquid coolant remains substantially in a liquid state.

8. The cold plate of claim 1, further comprising:
a flexible pipe, coupled to the coolant port for transferring liquid coolant to and/or from the coolant port.

9. An electronics module, comprising:
a module housing;
an electronic device mounted within the module housing; and
a cold plate according to claim 1 mounted on the electronic device, such that heat generated by the electronic device is transferred through the thermal interface of the cold plate.

10. The electronics module of claim 9, further comprising:
a pipe, coupled to the coolant port for transferring liquid coolant to and/or from the coolant port; and
wherein the module housing comprises an opening, the pipe passing through the opening such that liquid coolant flows exterior the module housing.

11. The electronics module of claim 9, wherein the module housing is substantially planar and defines a height dimension perpendicular to the plane of the housing, a combined size of the electronic device and cold plate in the height dimension being at least 80% of a size of the module housing in the height dimension.

12. The electronics module of claim 9, wherein the electronic device is a first electronic device and the cold plate is a first cold plate, the electronics module further comprising:
a second electronic device mounted within the module housing; and
a second cold plate comprising:
a housing, a surface of the housing being arranged to provide a thermal interface for cooling an electronic device thermally coupled thereto;
at least one channel within the housing and proximate to the surface, arranged for a liquid coolant to flow therethough such that heat received by the thermal interface is transferred to the liquid coolant; and
a coolant port extending outside the housing, for transferring liquid coolant to and/or from the at least one channel; and
wherein one or more of: (a) a cross-sectional area of an outlet from the coolant port to the at least one channel is no larger than a cross-sectional area of the at least one channel at the outlet; (b) pins and/or fins are arranged within the at least one channel adjacent to the coolant port so as to cause liquid coolant entering the at least one channel to flow in all directions in a plane parallel to the surface; and (c) the coolant port is configured to cause liquid coolant to enter and/or exit the at least one channel in a direction perpendicular to the surface;

wherein the cold plate is mounted on the second electronic device, such that heat generated by the second electronic device is transferred through the thermal interface of the second cold plate.

13. The electronics module of claim 12, further comprising:

a piping arrangement, coupled to the coolant port of the first cold plate and to the coolant port of the second cold plate for transferring liquid coolant to and from the first cold plate and to and from the second cold plate; and wherein the piping arrangement is configured to transfer liquid coolant to and from the first cold plate and to and from the second cold plate in series or in parallel.

14. An electronics system, comprising:

a plurality of electronics modules, each of which is in accordance with claim 9;

a piping network, configured to transfer liquid coolant to and from each of the electronics modules; and a heat exchanger arrangement, arranged to receive liquid coolant from each of the electronics modules through the piping network, transfer heat from the received liquid coolant to at least one heat sink, cooling the liquid coolant thereby and direct the cooled liquid coolant to the plurality of electronics modules.

15. The electronics system of claim 14, wherein the piping network is arranged to transfer liquid coolant to and from the plurality of electronics modules in series or in parallel.

16. The cold plate of claim 1, wherein a width of the at least one channel in the first portion is greater than a width of the at least one channel in the second portion.

17. The cold plate of claim 1, wherein the first pattern is configured so as to prevent unobstructed flow of liquid coolant between the first coolant port and the second coolant port and the second pattern is configured to allow unobstructed flow of liquid coolant between the first coolant port and the second coolant port.

18. The cold plate of claim 1, wherein the first portion of the at least one channel is adjacent the first coolant port and the pins and/or fins are arranged in the first pattern in a third portion of the at least one channel, adjacent the second coolant port, the second portion of the at least one channel being between the first portion and the third portion.

19. The electronics module of claim 11, wherein the size of the module housing in the height dimension is 1 rack unit.

20. The electronics system of claim 14, wherein the liquid coolant essentially comprises water.

* * * * *